United States Patent
Lee et al.

(10) Patent No.: US 10,439,447 B2
(45) Date of Patent: Oct. 8, 2019

(54) METHOD OF MANUFACTURING MAGNETIC SHIELDING BLOCK FOR WIRELESS POWER CHARGERS

(71) Applicant: LG INNOTEK CO., LTD., Seoul (KR)

(72) Inventors: Yun Bok Lee, Seoul (KR); Sang Won Lee, Seoul (KR); Hyung Jun Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 15/294,271

(22) Filed: Oct. 14, 2016

(65) Prior Publication Data

US 2017/0155288 A1   Jun. 1, 2017

(30) Foreign Application Priority Data

Nov. 27, 2015   (KR) .................. 10-2015-0167041

(51) Int. Cl.
| | |
|---|---|
| *H02J 50/70* | (2016.01) |
| *G01R 31/12* | (2006.01) |
| *H02J 50/23* | (2016.01) |
| *H02J 50/40* | (2016.01) |
| *G01R 33/12* | (2006.01) |
| *H01F 1/03* | (2006.01) |
| *H01F 41/02* | (2006.01) |

(Continued)

(52) U.S. Cl.
CPC .......... *H02J 50/70* (2016.02); *G01R 33/0076* (2013.01); *G01R 33/025* (2013.01); *G01R 33/1223* (2013.01); *H01F 1/0306* (2013.01); *H01F 1/26* (2013.01); *H01F 27/365* (2013.01); *H01F 38/14* (2013.01); *H01F 41/02* (2013.01); *H02J 7/025* (2013.01); *H02J 50/23* (2016.02); *H02J 50/40* (2016.02); *H05K 9/0075* (2013.01); *G01R 31/1227* (2013.01); *H02J 50/12* (2016.02)

(58) Field of Classification Search
CPC .. H02J 50/70; H02J 50/23; H02J 50/40; H02J 7/025; G01R 31/1227; G01R 33/1223; H01F 1/0306; H01F 41/02; H05K 9/0075
See application file for complete search history.

(56) References Cited

U.S. PATENT DOCUMENTS

| | | | |
|---|---|---|---|
| 2004/0075616 A1* | 4/2004 | Endo | G06K 19/0726 343/895 |
| 2009/0116990 A1* | 5/2009 | Unoki | B22F 1/02 419/19 |

FOREIGN PATENT DOCUMENTS

| | | |
|---|---|---|
| CN | 100399627 C | 7/2008 |
| CN | 101213041 A | 7/2008 |

(Continued)

*Primary Examiner* — Mathieu D Vargot
(74) *Attorney, Agent, or Firm* — Birch, Stewart, Kolasch & Birch, LLP

(57) ABSTRACT

Embodiments provide a magnetic shield for wireless power chargers and a method of manufacturing the same. The method includes forming flake powder having flake-type particles, forming an oxide film by performing oxygen heat treatment on the surface of the flake powder, performing insulation treatment on the surface of the flake powder provided with the oxide film formed thereon, and producing a sendust block by mixing and melting the insulation-treated flake powder and insulative resin powder. Therefore, a magnetic shield having high insulation characteristics and magnetic permeability may be provided.

7 Claims, 7 Drawing Sheets

(51) Int. Cl.
*H02J 7/02* (2016.01)
*H05K 9/00* (2006.01)
*G01R 33/00* (2006.01)
*G01R 33/025* (2006.01)
*H01F 1/26* (2006.01)
*H01F 27/36* (2006.01)
*H01F 38/14* (2006.01)
*H02J 50/12* (2016.01)

(56) References Cited

FOREIGN PATENT DOCUMENTS

| | | | |
|---|---|---|---|
| CN | 101615465 A | | 12/2009 |
| CN | 103023159 A | | 4/2013 |
| CN | 104011814 A | | 8/2014 |
| JP | 2006-307209 A | | 11/2006 |
| JP | 2007-138197 | * | 6/2007 |
| JP | 2010-10673 A | | 1/2010 |
| KR | 10-2008-0077563 A | | 8/2008 |
| KR | 10-2013-0072181 A | | 7/2013 |
| KR | 10-2013-0087455 A | | 8/2013 |
| KR | 10-2015-0115271 A | | 10/2015 |

* cited by examiner

METHOD OF MANUFACTURING MAGNETIC SHIELDING BLOCK FOR WIRELESS POWER CHARGERS

CROSS REFERENCE TO RELATED APPLICATION

This application claims priority under 35 U.S.C. § 119 to Korean Patent Application No. 10-2015-0167041, filed in Korea on Nov. 27, 2015, which is hereby incorporated in its entirety by reference as if fully set forth herein.

TECHNICAL FIELD

Embodiments relate to wireless power transmission technology, and more particularly, to a magnetic shielding block for wireless power chargers having high magnetic shielding performance and magnetic permeability and a method of manufacturing the same.

BACKGROUND

Recently, as information and communication technology is rapidly developed, a ubiquitous society based on information and communication technology has been realized.

In order to be connected to information and communication equipment anywhere and at any time, sensors in which computer chips having a communication function are mounted should be installed in social facilities. Therefore, power supply to these facilities and sensors is a new problem. Further, as the variety of kinds of portable devices including not only mobile phones but also Bluetooth headsets, music players, such as iPods, etc., is rapidly increased, battery charging burdens a worker with time and additional work. In order to solve such a problem, wireless power transmission technology is receiving attention.

Wireless power transmission or wireless energy transfer is technology for wirelessly transmitting electrical energy from a transmitter to a receiver using electromagnetic induction. Electric motors or transformers using electromagnetic induction began to be used in the 1800s and, since then, electrical energy transmission methods using radiation of electromagnetic waves, such as radio waves, lasers, high-frequency waves and microwaves, have been attempted. Electric toothbrushes and some wireless razors, which are frequently used, are charged using electromagnetic induction.

Wireless energy transfer that is available at present may be classified into a magnetic induction method, an electromagnetic resonance method, an RF transmission method using a short-wavelength wireless frequency, etc.

The magnetic induction method is technology using a phenomenon in which, when current is applied to one of two coils disposed adjacent to each other, a magnetic flux occurs and then creates electromotive force in the other coil, and has now been rapidly commercialized in small devices such as mobile phones. The magnetic induction method may transmit power of hundreds of kW at most and have high efficiency, but the maximum transmission distance is 1 cm or less and thus the coils must be disposed adjacent to a charger or the floor.

The electromagnetic resonance method uses electric fields or magnetic fields instead of electromagnetic waves or current. The electromagnetic resonance method is scarcely influenced by electromagnetic wave problems and is thus safe for other electronic devices or humans. On the other hand, the electromagnetic resonance method is disadvantageous in that it is applicable only at a limited distance and in a limited space and in that the energy transmission efficiency is rather low.

The short-wavelength wireless power transmission method, i.e., the RF transmission method, uses the fact that energy of a radio wave type may be directly transmitted or received. Such technology is an RP-type wireless power transmission method using a rectenna, and the rectenna, which is a portmanteau word of "antenna" and "rectifier", means an element for converting RF power directly into DC power. That is, the RF method is technology in which AC radio waves are converted into DC, and, recently, as the efficiency of the RF method is improved, research on commercialization of the RF method is vigorously carried out.

The wireless power transmission technology is applicable to various industries, i.e., not only to the mobile industry but also to vehicle, IT, railway and household appliance industries.

In general, a wireless power transmitter is provided with coils for wireless power transmission, hereinafter referred to as "transmission coils", and various shields for preventing electromagnetic fields, generated by the transmission coils, or AC power from being transmitted to a control substrate are used.

As representative shields, there are a magnetic shielding sheet and a sendust block formed by processing magnetic metal powder.

However, most conventional sendust blocks provided in wireless power transmitters have poor insulating properties and thus require separate insulating sheets to be attached thereto, and various electronic parts and terminals may not be integrated with the sendust blocks owing to the poor insulating properties thereof.

Particularly, a wireless power transmitter mounted in a vehicle requires strong robustness to vibration of the vehicle during driving and thus the necessity to integrate various electronic parts and terminals with the sendust block is increased.

Further, with regard to the characteristics of wireless charging, the sendust block requires not only high insulating performance of an AC component but also requires high magnetic permeability in order to maximize wireless power transmission efficiency.

SUMMARY

Embodiments provide a magnetic shielding block for wireless power chargers and a method of manufacturing the same.

Further, embodiments provide a sendust block which has high insulating performance of an AC component and high magnetic permeability, and a method of manufacturing the same.

Further, embodiments provide a magnetic shielding block which has terminals integrated therewith, facilitates assembly of parts and provides a wireless power charger having high durability, and a method of manufacturing the same.

In one embodiment, a method of manufacturing a magnetic shield includes forming flake powder having flake-type particles, forming an oxide film by performing oxygen heat treatment on the surface of the flake powder, performing insulation treatment on the surface of the flake powder provided with the oxide film formed thereon, and producing a sendust block by mixing and melting the insulation-treated flake powder and insulative resin powder.

Formation of the flake powder may include producing soft magnetic metal alloy powder having spherical particles using water atomization or gas atomization and compressing the soft magnetic metal alloy powder.

Performance of insulation treatment may be carried out by applying a chemical additive to the surface of the flake powder provided with the oxide film formed thereon.

The chemical additive may include at least one of phosphate, a lubricant, such as Kenolube™, kaolin, talc, magnesium hydroxide, aluminum oxide ($Al_2O_3$), Zn-stearate, Mg-stearate and sodium silicate.

The sendust block may be produced by mixing the insulation-treated flake powder and the insulative resin powder such that particles of the insulation-treated flake powder are spaced apart from each other and uniformly arranged in the sendust block, and then performing heat treatment so as to melt the insulative resin powder.

Production of the sendust block may include producing a molten resin by mixing hie insulation-treated flake powder and the insulative resin powder and then melting the insulative resin powder through heat treatment, and injecting the molten resin into a prefabricated mold through a side gate provided at one side of the mold in the horizontal direction so as to produce the sendust block through injection molding.

The method may further include performing an insulation test by applying AC current to the produced sendust block, and upon judging that the sendust block fails the insulation test, performing insulating coating on the surface of the sendust block.

The method may further include measuring magnetic permeability of the sendust block, and judging whether or not the sendust block passes inspection based on the measured magnetic permeability.

Terminals may be formed integrally with the sendust block.

The insulative resin powder may be formed of a polyimide-based resin or a phenol-based resin.

In a further embodiment, a magnetic shield includes a plurality of fine flake powder particles formed by injection molding through a side gate provided in an injection mold and stacked so as to be uniformly spaced apart from each other, the surfaces of the flake powder particles being insulation-treated, and an insulative resin melted through high-pressure heat treatment so as to insulate the flake powder particles from each other.

In another embodiment, a wireless power transmission device includes a sendust block produced by injection-molding a insulative resin mixed with a plurality of flake powder particles having heat-treated surfaces, and having AC current insulating characteristics, terminals formed integrally with the sendust block, transmission coils fastened to designated sides of the terminals and mounted in coil grooves formed on the sendust block so as to transmit wireless power, and a control circuit board fastened to the other sides of the terminals so as to control power supplied to the transmission coils.

The sendust block may be configured such that the flake powder particles in the sendust block are stacked so as to be uniformly spaced apart from each other.

The surface of the sendust block may be insulation-coated.

In yet another embodiment, a wireless power transmission device includes a sendust block configured such that first and second transmission coil grooves corresponding to the shapes of transmission coils and connection terminals soldered to both ends of the transmission coils are formed integrally with the sendust block by injection-molding, first and second transmission coils mounted in the first and second transmission coil grooves, and a third transmission coil mounted so as to overlap the first and second transmission coils.

The wireless power transmission device may further include first and second protrusions formed within the first and second transmission coil grooves so as to support the third transmission coil.

The wireless power transmission device may further include an external guide connecting the first and second transmission coil grooves at the outside so as to support the third transmission coil.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
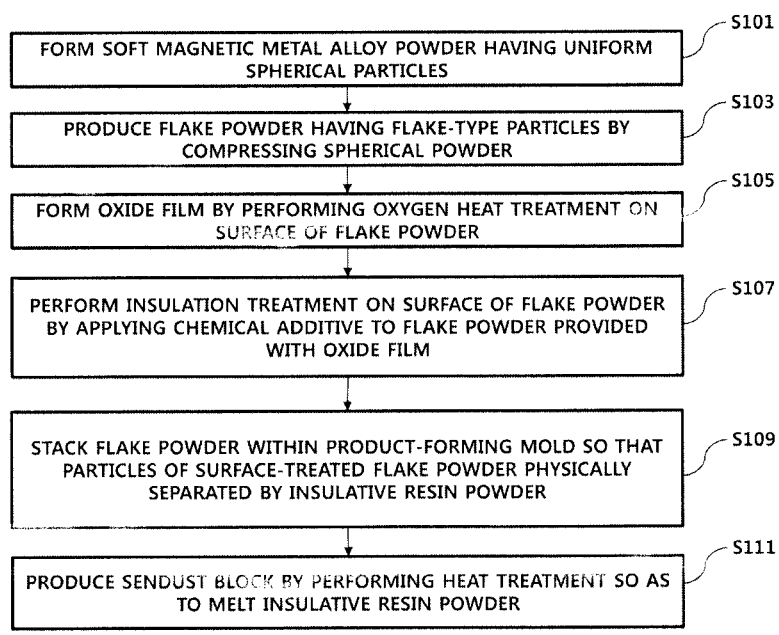
FIG. 1 is a flowchart schematically illustrating a method of manufacturing a sendust block in accordance with one embodiment.

Hereinafter, apparatuses and methods to which embodiments are applied will be described in detail with reference to the appended drawings. The suffixes "module" and "unit" used in the description below are given or used together only in consideration of ease in preparation of the specification and do not have distinctive meanings or functions.

In the following description of the embodiments, it will be understood that, when each element is referred to as being "on" or "under" another element, it can be directly "on" or "under" the other element, or may be indirectly formed with one or more intervening elements therebetween. In addition, it will also be understood that "on" or "under" one element may mean the upward direction or the downward direction of the element.

In the following description of the embodiments, as terms for a device for transmitting wireless power in a wireless power system, "wireless power transmitter", "wireless power transmission device", "wireless electricity transmission device", "wireless electricity transmitter", "transmission terminal", "transmitter", "transmission device", "transmission side", etc. may be used interchangeably for convenience of description. Further, as terms for a device for receiving wireless power from a wireless power transmission device, "wireless electricity reception device", "wireless electricity receiver", "wireless power reception device", "wireless power receiver", "reception terminal", "reception side", "receiver", etc. may be used interchangeably for convenience of description.

Transmitters in accordance with the embodiments may be formed in a pad type, a holder type, an access-point (AP) type, a small base-station type, a stand type, a ceiling-embedded type, a wall-mounted type, etc., and one transmitter may transmit power to a plurality of wireless electricity reception devices. For this purpose, the transmitter may be provided with at least one wireless power transmission means. Here, the wireless power transmission means may employ various wireless power transmission standardizations based on an electromagnetic induction method in which a power transmission terminal coil generates a magnetic field and a reception terminal coil is charged with power under the influence of the magnetic field using electromagnetic induction. Here, the wireless power transmission means may include wireless charging technology based on electromagnetic induction, as defined by the Wireless Power Consortium (WPC) and the Power Matters Alliance (PMA), which are wireless charging technology standardization organizations.

Further, a receiver in accordance with one embodiment may be provided with at least one wireless power reception means and may receive wireless power simultaneously from two or more transmitters. Here, the wireless power reception means may include wireless charging technology based on electromagnetic induction, as defined by the Wireless Power Consortium (WPC) and the Power Matters Alliance (PMA) which are wireless charging technology standardization organizations.

Receivers in accordance with the embodiments may be used in small electronic devices, including a mobile phone, a smartphone, a laptop computer, a digital broadcasting terminal, a personal digital assistant (PDA), a portable multimedia player (PMP), a navigation system, an MP3 player, an electric toothbrush, an electronic tag, a lighting device, a remote controller, a float, a wearable device, such as a smart watch, etc., but the disclosure is limited thereto and the receivers may be used in any device in which a wireless power reception means in accordance with one embodiment may be installed such that a battery is chargeable.

FIG. 1 is a flowchart schematically illustrating a method of manufacturing a sendust block in accordance with one embodiment.

Soft magnetic metal alloy powder used to manufacture a sendust block in accordance with one embodiment may be manufactured by finely grinding a ribbon manufactured by rapid cooling through a single rolling process, which is one of traditional rapid solidification processes, or may be manufactured by high-pressure water atomization. As another example, soft magnetic metal alloy powder may be acquired by rapidly cooling a molten alloy raw material, free falling from a blast furnace through a nozzle provided at one side of the lower end of the blast furnace, by injecting inert cooling gas at a high pressure, for example, nitrogen ($N_2$), helium (He), neon (Ne) or argon (Ar), to the molten alloy raw material through an injection nozzle, but the disclosure is not limited thereto and soft magnetic metal alloy powder may be acquired through various other methods.

With reference to FIG. 1, soft magnetic metal alloy powder having uniform spherical particles may be acquired through a method, such as high-pressure water atomization or high-pressure gas atomization (Operation S101).

Flake powder having flake-type particles may be acquired by compressing the soft magnetic metal alloy powder having uniform spherical particles (Operation S103). The flake powder is suitable for metal particle density improvement of the sendust block and, if flake-type metal particles in the sendust block are uniformly arranged in a plane direction, induces a magnetic field flow in the plane direction, thus maximizing magnetic characteristics in the plane direction.

An oxide film may be formed by performing oxygen heat treatment on the surface of the acquired flake powder (Operation S105). In general, soft magnetic metal alloy powder has low electrical resistance. If metal powder particles are not insulated from each other and the metal powder particles contact each other, smooth current flow is enabled but a short-circuit may occur.

In order to solve such a problem, in accordance with one embodiment, a chemical additive for surface insulation treatment may be applied to the oxidized surface of the flake powder (Operation S107). In general, the surface state of metal alloy powder is physically/chemically stabilized by metallic bonds and is thus difficult to bond with other additives. Therefore, in order to induce bonding between the metal alloy powder and the chemical additive, oxidation of the surface of the metal alloy particle (Operation S105) may be performed. By performing minute oxygen heat treatment on the surface of the flake powder, a thin oxide film is formed on the surface of the flake powder and the oxide film may have insulating properties. When the oxide film is formed on the surface of the flake powder, bonds are formed between ions located on the outermost surface of the flake powder and oxygen ions, and thus the surface of the flake powder may remain in an unstable state and the chemical additive for surface insulation of the flake powder may be easily combined or joined with the surface of the flake powder. The chemical additive used for surface insulation of the flake powder in accordance with one embodiment may employ phosphate, a lubricant, such as Kenolube™, kaolin, talc, magnesium hydroxide, aluminum oxide ($Al_2O_3$), Zn-stearate, Mg-stearate, a silicon (Si)-based chemical additive, such as sodium silicate, a calcium (Ca)-based chemical additive, or a zinc (Zn)-based chemical additive, but the disclosure is not limited thereto.

The flake powder and insulative resin powder may be stacked in a product-forming mold so that particles of the flake powder having the insulation-treated surfaces are physically separated by the insulative resin powder (Operation S109). Here, the insulative resin powder is used to increase insulation between flake powder particles and bonding force when the sendust block is molded and may employ a polyimide-based resin or a phenol-based resin, but the disclosure is not limited thereto.

Particularly, as the chemical additive and the insulative resin powder used for insulation of the surface of the flake powder, materials having high bonding force may be used.

Thereafter, a sendust block may be produced by performing heat treatment to melt the stacked insulative resin powder (Operation S111).

Figure 2:
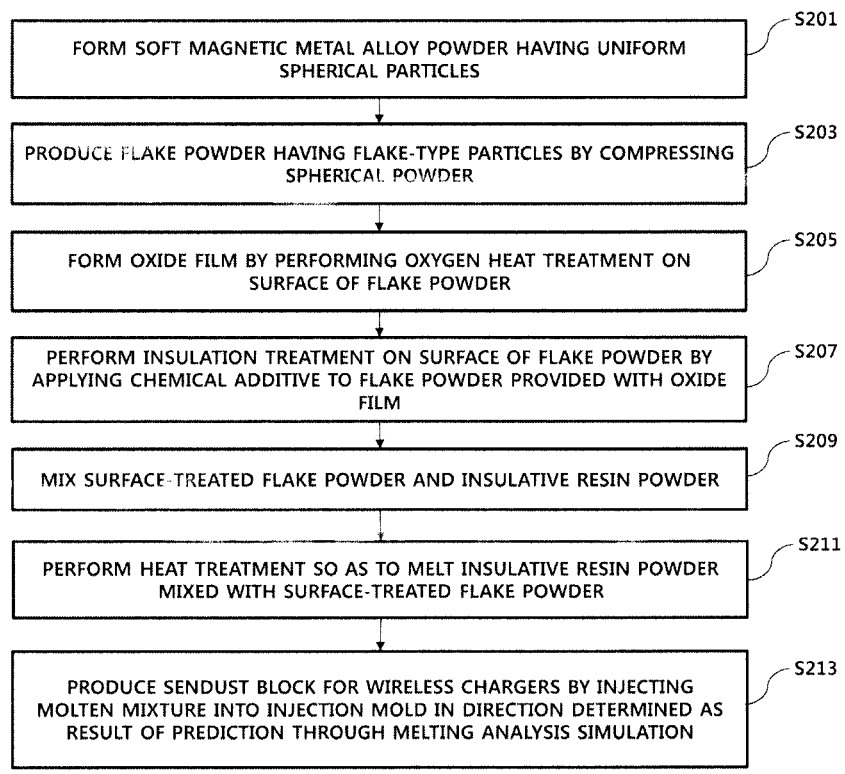
FIG. 2 is a flowchart schematically illustrating a method of manufacturing a sendust block in accordance with another embodiment.

FIG. 2 is a flowchart schematically illustrating a method of manufacturing a sendust block in accordance with another embodiment.

With reference to FIG. 2, soft magnetic metal alloy powder having uniform spherical particles may be acquired through a method, such as high-pressure water atomization or high-pressure gas atomization (Operation S201).

Flake powder having flake-type particles may be acquired by compressing the soft magnetic metal alloy powder having uniform spherical particles (Operation S203).

An oxide film may be formed by performing oxygen heat treatment on the surface of the acquired flake powder (Operation S205).

A chemical additive for surface insulation treatment may be applied to the surface of the flake powder on which the oxide film is formed (Operation S207).

The flake powder having the insulation-treated surface and insulative resin powder may be mixed, and heat treatment of an acquired mixture may be performed in a blast furnace so that the mixture is melted (Operations S209 and S211).

Thereafter, a sendust block may be produced by injecting the molten mixture into an injection mold in a direction determined as a result of prediction through a melting analysis simulation (Operation S213). Here, the injection mold may be configured to have the shape of a sendust block used in a wireless power transmission device. Terminals to connect transmission coils and sensing circuits mounted in the wireless power transmission device to a control circuit board may be formed integrally with the injection-molded sendust block, the transmission coils and the sensing circuits are fastened to designated sides of each of the terminals, and the other sides of the terminals may be fastened to the control circuit board. Therefore, power may be controlled through the transmission coils by the control circuit board, and sensing information sensed by the sensing circuits, for example, including a temperature sensing circuit, a voltage/current sensing circuit, etc., may be transmitted to the control circuit board.

Particularly, the direction in which the molten mixture is injected into the injection mold during injection molding may be the horizontal direction through a side gate. The melting analysis simulation is a tool for predicting the arrangement shape of particles of the flake powder in the injection mold according to the injection direction when the molten mixture is injected into the injection mold.

As a result of the melting analysis simulation, it is confirmed that injection of the molten mixture including the flake metal powder into the injection mold in the horizontal direction provides uniform stack arrangement, rather than injection of the molten mixture in the vertical direction. Actually, even in a test of manufactured sendust blocks, it is confirmed that injection of the molten mixture into the injection mold in the horizontal direction, i.e., injection of the molten mixture through a side gate, achieves excellent AC insulating characteristics and magnetic permeability, rather than injection of the molten mixture into the injection mold in the vertical direction, i.e., injection of the molten mixture through a pin point.

Figure 3:
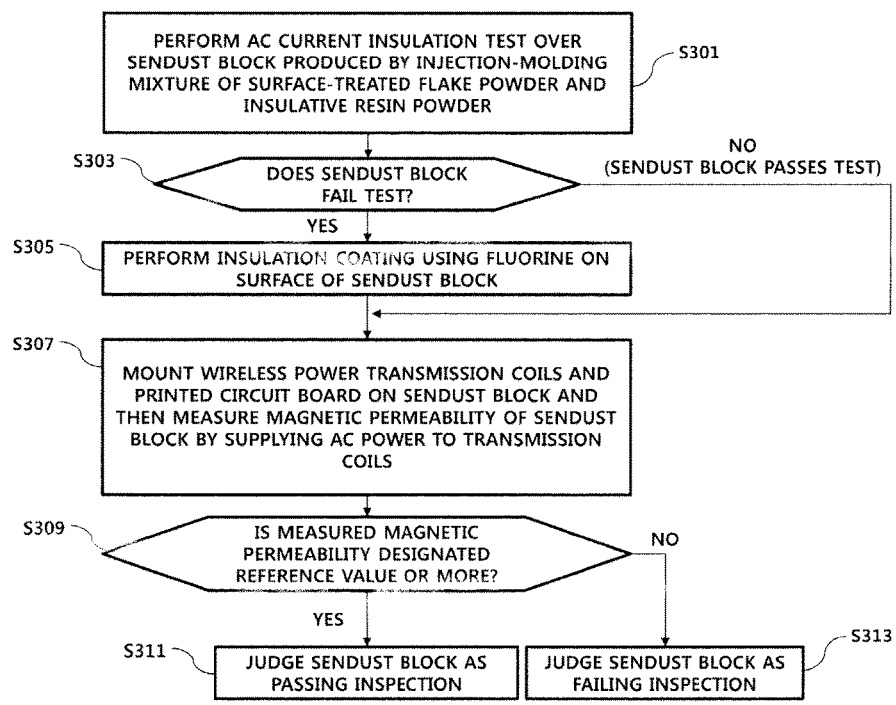
FIG. 3 is a flowchart illustrating a product-testing process of a sendust block manufactured by the method shown in FIG. 1 or 2, in accordance with one embodiment.

FIG. 3 is a flowchart illustrating a product-testing process of a sendust block manufactured by the method shown in FIG. 1 or 2, in accordance with one embodiment.

With reference to FIG. 3, an insulation test may be performed by applying AC current to a sendust block manufactured by injection-molding a mixture of flake powder, the surface of which is insulation-treated, and insulative resin powder (Operation S301).

As a result of the insulation test, upon judging that the sendust block fails the insulation test, insulating coating may be performed by applying fluorine, etc., to the surface of the sendust block (Operation S303). As another example, as a result of the insulation test, upon judging that the sendust block fails the insulation test, an insulating tape may be attached to one side of the surface of the sendust block or one side of a non-insulating surface of the sendust block.

Thereafter, magnetic permeability of the sendust block may be measured by mounting wireless power transmission coils and a printed circuit board (or a control circuit board) in the sendust block and then supplying AC power to the transmission coils (Operation S305).

Whether or not the measured magnetic permeability is a designated reference value or more is judged and, as a result of judgment, upon judging that the measured magnetic permeability is the designated reference value or more, the corresponding sendust block may be judged as passing inspection (Operation S309 and Operation S311).

On the other hand, as a result of judgment, upon judging that the measured magnetic permeability is less than the designated reference value, the corresponding sendust block may be judged as failing inspection (Operation S309 and Operation S313).

In Operation S303, upon judging that the sendust block passes the insulation test, Operation S307 may be performed.

In a wireless charging system, magnetic permeability is directly related to wireless power transmission efficiency. If a sendust block in accordance with one embodiment has high magnetic field shielding efficiency, magnetic permeability of electromagnetic waves transmitted from a transmission coil (a primary coil) to a reception coil (a secondary coil) of a reception terminal may be high. That is, the sendust block is used as a core material to increase a coupling coefficient between the primary coil and the secondary coil.

If the sendust block has low magnetic field shielding efficiency, the magnetic flux generated by the transmission coil may be transmitted to the control board in the wireless power transmission device and heating due to eddy current generated by electromagnetic flow may occur within the device. This may cause damage to the device and block the transmission of large amounts of power, resulting in long charging times.

Therefore, performance of the sendust block serving as a magnetic shield may considerably influence charging efficiency as well as safety of the inside of the device.

Magnetic permeability may be increased in proportion to increase in magnetic field shielding efficiency by the sendust block.

Figure 4:
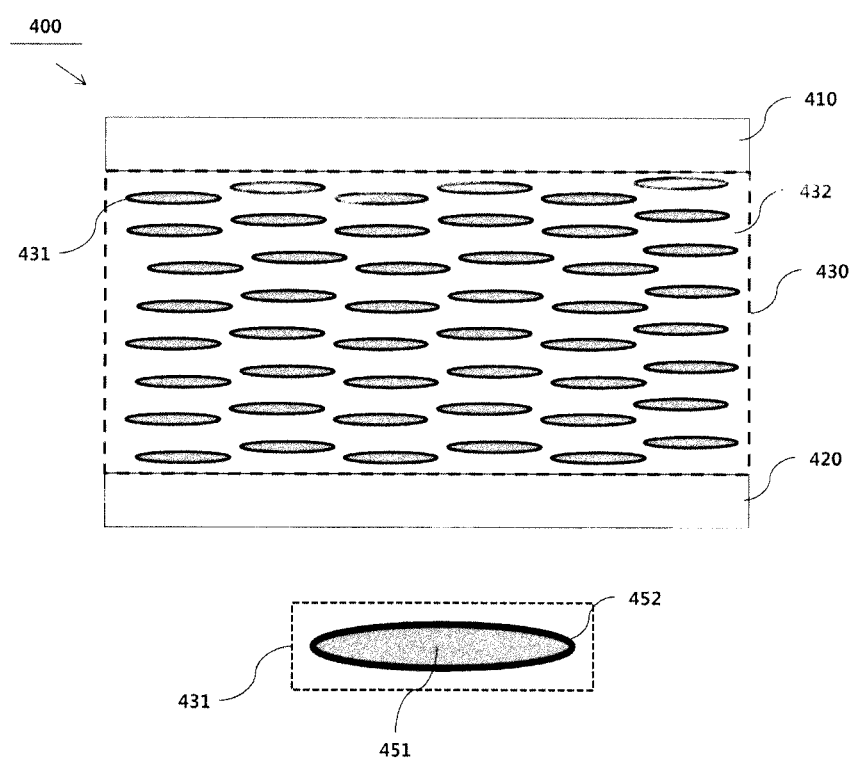
FIG. 4 is a schematic view illustrating a laminated structure of a sendust block manufactured by the process shown in FIGS. 1 to 3.

FIG. 4 is a schematic view illustrating a laminated structure of a sendust block manufactured by the process shown in FIGS. 1 to 3.

With reference to FIG. 4, a sendust block 400 may include a core layer 430 including flake powder 431, the surface of which is insulation-treated, and an insulating material 432 formed by melting insulative resin powder to insulate the particles of the flake powder 431 from each other, and insulation coating layers 410 and 420 to insulate the outer surfaces of the core layer 430 of the sendust block 400 and to prevent oxidation of the core layer 430.

Here, since particles of the flake powder 431 are uniformly stacked, the core layer 430 may have high magnetic performance in the plane direction and have a high density of metal particles.

Particularly, the flake powder 431 may include soft magnetic metal alloy powder 451 and a chemical additive 452 applied to the surface of the soft magnetic metal alloy powder 451 so as to achieve surface insulation. As another example, the flake powder 431 may include specific metal particles having conductivity and a chemical additive applied to the surfaces of the metal particles so as to achieve surface insulation.

Figure 5:
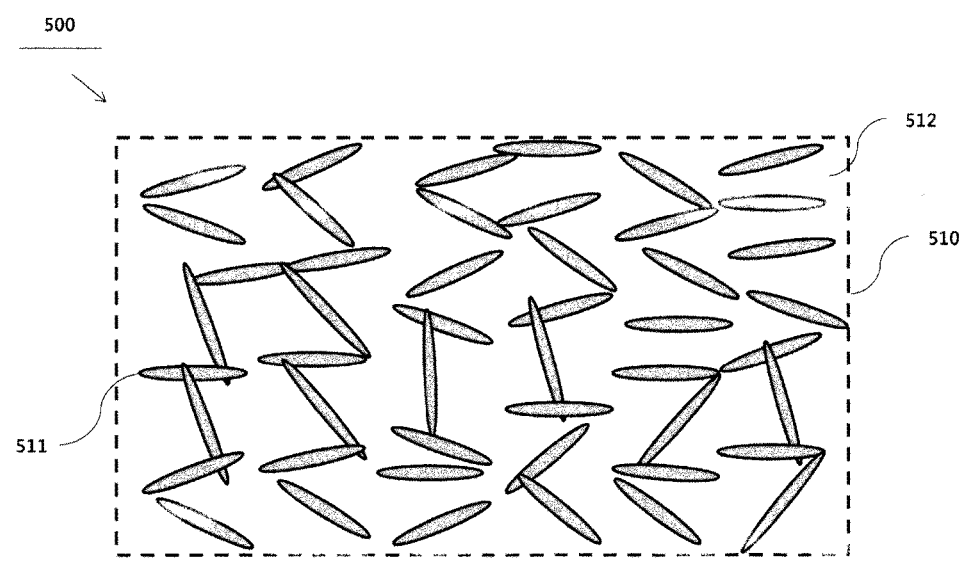
FIG. 5 is a view illustrating a sendust block formed of flake powder having irregular particle arrangement and problems caused thereby.

FIG. 5 is a view illustrating a sendust block formed of flake powder having irregular particle arrangement and problems caused thereby.

If particles of flake powder 511 included in a core layer 510 of a sendust block 500 are irregularly arranged, the particles of the flake powder 511 may contact each other and cause a current flow in the core layer 510 and, thus, the flake powder 511 may not function as an insulator. Further, if the particles of the flake powder 511 are exposed to the outside of the core layer 510, a terminal and an electronic part may not be directly connected to the sendust block 500. Moreover, the particles of the flake powder 511 exposed to the outside of the core layer 510 are easily oxidized and thus durability of the sendust block 500 is lowered.

Figure 6:
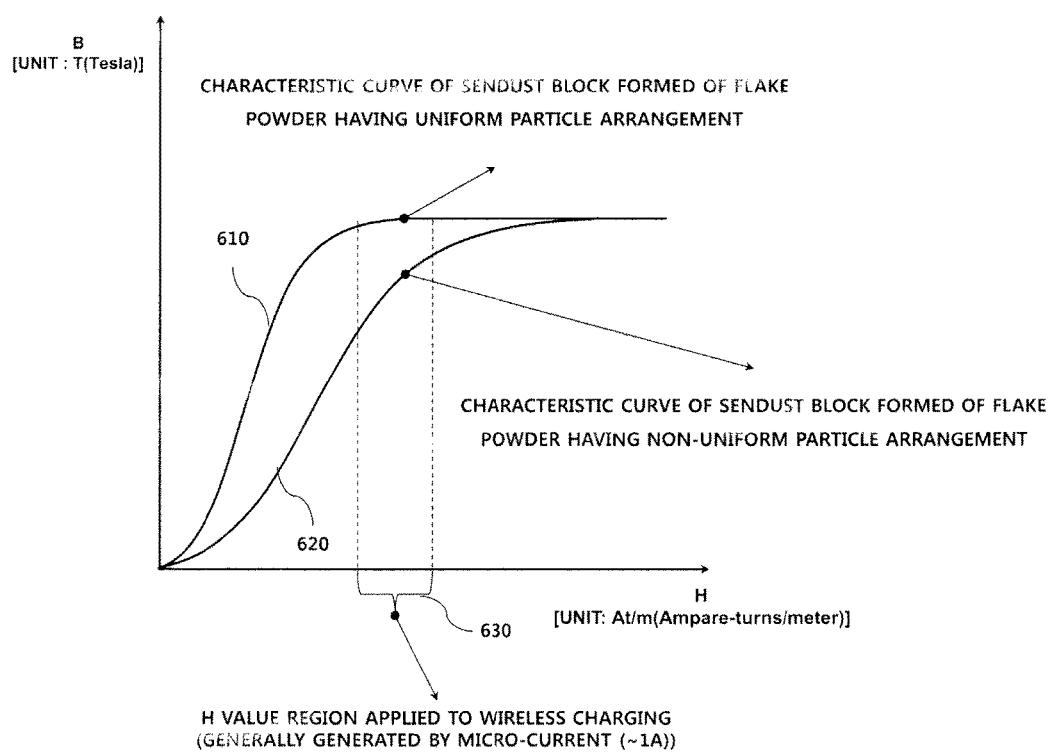
FIG. 6 is a graph showing magnetic flux density characteristics over magnetizing force density according to arrangement patterns in sendust blocks formed of flake powder.

FIG. 6 is a graph showing magnetic flux density characteristics over magnetizing force density according to arrangement patterns in sendust blocks formed of flake powder.

With reference to FIG. 6, a magnetic flux characteristic curve 610 of the sendust block 400 formed of flake powder having uniform particle arrangement shown in FIG. 4 over magnetizing force density shows stable distribution of magnetic flux density B in an H (magnetizing force density) value section 630 applied to a wireless charging system.

On the other hand, a magnetic flux characteristic curve 620 of the sendust block 500 formed of flake powder having non-uniform particle arrangement shown in FIG. 5 over magnetizing force density shows unstable distribution of magnetic flux density B in the H (magnetizing force density) value section 630 applied to the wireless charging system. That is, in the H (magnetizing force density) value section 630 applied to the wireless charging system, as the magnetizing force density H increases, the magnetic flux density B increases linearly.

As exemplarily shown in FIG. 6, it may be confirmed that the sendust block 400 formed of flake powder having uniform particle arrangement has higher magnetic field shielding performance than the sendust block 500 formed of flake powder having non-uniform particle arrangement and thus has high magnetic permeability.

Figure 7:
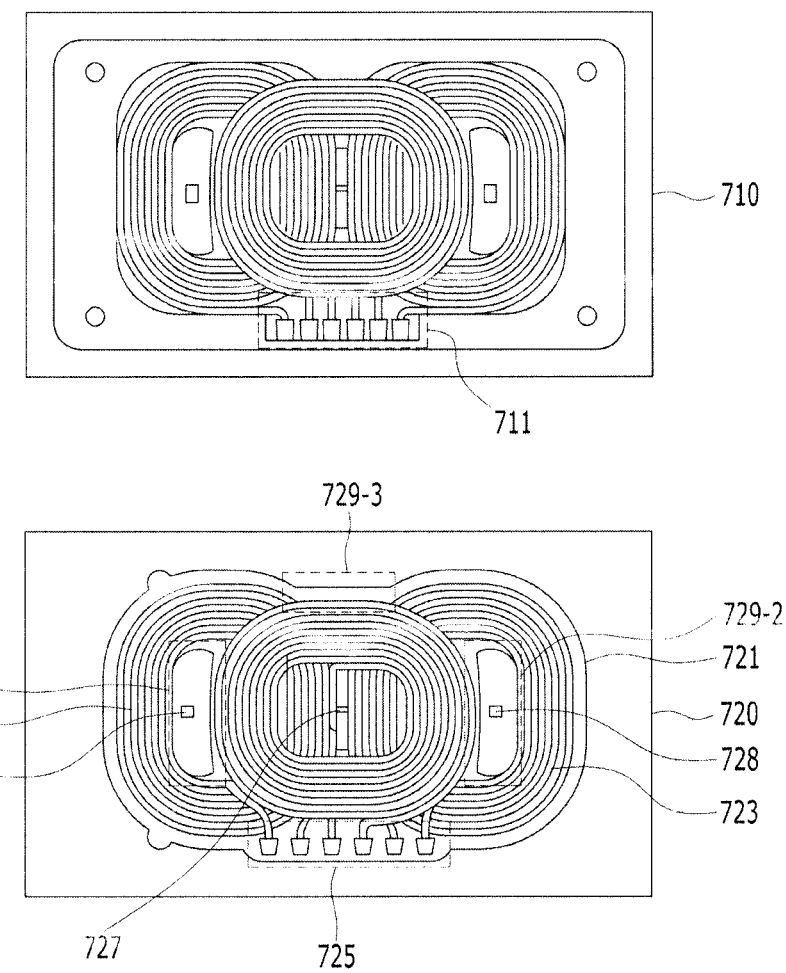
FIG. 7 is a view comparatively illustrating differences between a sendust block manufactured by a method of manufacturing a magnetic shield in accordance with one embodiment and a conventional sendust block.

FIG. 7 is a view comparatively illustrating differences between a sendust block produced by a method of manufacturing a magnetic shield in accordance with one embodiment and a conventional sendust block.

Reference numeral 710 represents a transmission coil mounting structure of a wireless power transmitter using a conventional sendust block and reference numeral 720 represents a transmission coil mounting structure of a wireless power transmitter using a sendust block 721 produced by a method of manufacturing a magnetic shield in accordance with one embodiment.

With regard to the transmission coil mounting structure 710, the sendust block of the conventional wireless power transmitter has poor insulation characteristics and thus separate terminals, which are exposed to the outside so as to connect transmission coils and various sensing circuits to a control board, are formed at one side of the sendust block. Therefore, coupling of the conventional wireless power transmitter with terminals is difficult, assembly efficiency the conventional wireless power transmitter is poor, and portions of the conventional wireless power transmitter around the coils are opened and thus the conventional wireless power transmitter has weak durability to vibration.

With regard to the transmission coil mounting structure 720, the sendust block 721 of the wireless power transmitter in accordance with this embodiment has excellent insulation characteristics and, thus, terminals 725 may be formed integrally with the sendust block 721 by injection molding, exposure of transmission coils to the outside may be minimized and the risk of opening and short-circuit of the coils owing to vibration may be minimized. Further, since terminals connected to the transmission coils and sensing elements may be formed integrally with the sendust block 721 by injection molding, the sendust block 721 in accordance with this embodiment may be easily assembled and repaired.

As exemplarily shown in the transmission coil mounting structure 720, first to third transmission coils 722, 723 and 724 may be mounted in the sendust block 721 of the wireless power transmitter. Here, the sendust block 721 of the wireless power transmitter may include first and second transmission coil grooves having the shapes of the first and second transmission coils 722 and 723 and formed by injection molding so as to mount the first and second transmission coils 722 and 723 therein.

Since the first and second transmission coils 722 and 723 are mounted in the first and second transmission coil grooves, formation of a gap between the first and second transmission coils 722 and 723 mounted in the sendust block 721 due to external impact may be minimized and thereby the possibility of opening and short-circuit of the first and second transmission coils 722 and 723 may be minimized.

The first and second transmission coils 722 and 723 and the third transmission coil 724 may be mounted in the sendust block 721 so that some region thereof may overlap each other. For example, the area of overlapping regions between the first or second transmission coil 722 or 723 and the third transmission coil 724 may be 50% or more of the entire area of the first or second transmission coil 722 or 723. Further, the area of overlapping regions between the third transmission coil 724 and the first and second transmission coils 722 and 723 may be 90% or more of the entire area of the third transmission coil 724.

The first and second transmission coils 722 and 723 and the third transmission coil 724 mounted in the sendust block 721 may be bonded using a designated adhesive unit. For example, the adhesive unit may employ a double-sided adhesive tape, silicone, etc., without being limited thereto, and any material may be used as the adhesive unit as long as the material may achieve insulation and attachment between the transmission coils.

Further, six terminal grooves 725 to mount connection terminals connected to both ends of the transmission coils 722, 723 and 724 may be formed integrally with the sendust block 721 by injection molding. Connection terminals may be respectively mounted in the terminal grooves 725 and both ends of the first to third transmission coils 722, 723 and 724 may be soldered to the corresponding connection terminals. Although this embodiment describes that the connection terminals are mounted in the terminal grooves 725 formed by injection molding and then both ends of the first to third transmission coils 722, 723 and 724 are soldered to the connection terminals, in the case of a sendust block in accordance with another embodiment, connection terminals may be formed integrally with the sendust block by injection molding. In this case, the sendust block in which the connection terminals are formed integrally with the sendust block 721 by injection molding may increase durability and be easily assembled, as compared to the sendust block 721 in which the terminal grooves 725 are formed and then the connection terminals are mounted in the terminal grooves 725. For example, the terminal grooves 725 may be formed at a position closest to the third transmission coil 724 out of the first to third transmission coils 722, 723 and 724.

Further, first and second sensing element grooves 726, 727 and 728 to mount temperature sensing elements for measurement of temperatures of the first to third transmission coils 722, 723 and 724 therein may be provided in the sendust block 721.

With reference to the transmission coil mounting structure 720, the wireless power transmission device in accordance with one embodiment may include the sendust block, with which the first and second transmission coil grooves having shapes corresponding to the shapes of the first and second transmission coils 722 and 723 and the connection terminals for soldering both ends of the transmission coils 722, 723 and 724 are formed integrally by injection molding, the first and second transmission coils 722 and 723 respectively mounted in the first and second transmission coil grooves, and the third transmission coil 724 attached to the first and second transmission coils 722 and 723 so as to partially overlap the first and second transmission coils 722 and 723.

Here, first and second protrusions 729-1 and 729-2 to support the third transmission coil 724 and to minimize a gap between the first and second transmission coils 722 and 723 may be further formed within the first and second transmission coil grooves by injection molding.

Further, the sendust block may further include an external guide 729-3 connecting the first and second transmission coil grooves at the outside to support the third transmission coil 724.

As is apparent from the above description, the effects of a method and an apparatus in accordance with embodiments will be described, as follows.

The embodiments provide a magnetic shielding block for wireless power chargers and a method of manufacturing the same.

Further, the embodiments provide a sendust block which has high insulating performance of an AC component and high magnetic permeability, and a method of manufacturing the same.

Moreover, the embodiments provide a magnetic shielding block which has terminals integrated with the magnetic shielding block, facilitates assembly of parts and provides a wireless power charger having high durability, and a method of manufacturing the same.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a magnetic shield comprising:
   forming flake powder having flake particles;
   forming an oxide film by performing oxygen heat treatment on the surface of the flake powder;
   forming an insulation layer on the surface of the oxide film of the flake powder by applying a chemical additive to the surface of the oxide film; and
   producing a sendust block by mixing and melting the insulation-treated flake powder and insulative resin powder,
   wherein the sendust block is produced by mixing the insulation-treated flake powder and the insulative resin powder such that particles of the insulation-treated flake powder are spaced apart from each other and uniformly arranged in the sendust block, and then performing heat treatment so as to melt the insulative resin powder and form the magnetic shield.

2. The method according to claim 1, wherein formation of the flake powder includes:
   producing soft magnetic metal alloy powder having spherical particles using water atomization or gas atomization; and
   compressing the soft magnetic metal alloy powder.

3. The method according to claim 1, wherein the chemical additive includes at least one of phosphate, a lubricant, kaolin, talc, magnesium hydroxide, aluminum oxide ($Al_2O_3$), Zn-stearate, Mg-stearate and sodium silicate.

4. The method according to claim 1, further comprising:
   performing an insulation test by applying AC current to the produced sendust block; and
   upon judging that the sendust block fails the insulation test, performing insulating coating on the surface of the sendust block.

5. The method according to claim 4, further comprising:
   measuring magnetic permeability of the sendust block; and
   judging whether or not the sendust block passes inspection based on the measured magnetic permeability.

6. The method according to claim 1, wherein terminals are formed integrally with the sendust block.

7. The method according to claim 1, wherein the insulative resin powder is formed of a polyimide-based resin or a phenol-based resin.

* * * * *